United States Patent
Lin (10) Patent No.: US 10,466,546 B2
(45) Date of Patent: Nov. 5, 2019

(54) DISPLAY PANEL AND MANUFACTURING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventor: Hongtao Lin, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 14 days.

(21) Appl. No.: 15/511,614

(22) PCT Filed: Mar. 11, 2016

(86) PCT No.: PCT/CN2016/076132
§ 371 (c)(1),
(2) Date: Mar. 15, 2017

(87) PCT Pub. No.: WO2017/045383
PCT Pub. Date: Mar. 23, 2017

(65) Prior Publication Data
US 2017/0293175 A1    Oct. 12, 2017

(30) Foreign Application Priority Data
Sep. 15, 2015 (CN) .......................... 2015 1 0586958

(51) Int. Cl.
*G02F 1/1339* (2006.01)
*G02F 1/1335* (2006.01)
(Continued)

(52) U.S. Cl.
CPC ........ *G02F 1/13394* (2013.01); *G02F 1/1368* (2013.01); *G02F 1/133514* (2013.01);
(Continued)

(58) Field of Classification Search
CPC ........... G02F 1/13394; G02F 1/133514; G02F 1/1368; H01L 28/60; H01L 27/127; H01L 27/1262; H01L 27/1255
See application file for complete search history.

(56) References Cited

U.S. PATENT DOCUMENTS 6,975,379 B2 * 12/2005 Kim ...................... G02F 1/1339
                                                           349/106
9,482,906 B2 * 11/2016 Hirato ............... G02F 1/133371
(Continued)

FOREIGN PATENT DOCUMENTS

CN        1588189 A       3/2005
CN        1661425 A       8/2005
(Continued)

OTHER PUBLICATIONS

Office Action received for Chinese Patent Application No. 201510586958.8, dated Mar. 13, 2018, 6 pages (3 pages of English Translation and 3 pages of Office Action).
(Continued)

*Primary Examiner* — Latanya N Crawford
(74) *Attorney, Agent, or Firm* — Womble Bond Dickinson (US) LLP (57) ABSTRACT

The present disclosure provides a display panel and a manufacturing method thereof. The display panel comprises an array substrate and a color film substrate arranged in cell alignment, a pillar-shaped spacer located between the array substrate and the color film substrate and connected to the color film substrate, and a thin film transistor located on the array substrate. The pillar-shaped spacer is in contact with the thin film transistor, and a surface of the pillar-shaped spacer that is in contact with the thin film transistor is a curved surface. Alternatively, the array substrate further comprises a pillow-shaped spacer, and at least one of a surface of the pillow-shaped spacer that is in contact with the pillar-shaped spacer and a surface of the pillar-shaped spacer that is in contact with the pillow-shaped spacer is a curved surface.

16 Claims, 6 Drawing Sheets

(51) Int. Cl.
*G02F 1/1368* (2006.01)
*H01L 27/12* (2006.01)
*H01L 49/02* (2006.01)

(52) U.S. Cl.
CPC ........ *H01L 27/127* (2013.01); *H01L 27/1255* (2013.01); *H01L 27/1262* (2013.01); *H01L 28/60* (2013.01)

(56) References Cited

U.S. PATENT DOCUMENTS

| | | | | |
|---|---|---|---|---|
| 9,588,365 | B2* | 3/2017 | Tanaka | G02F 1/133345 |
| 2005/0185130 | A1 | 8/2005 | Oh et al. | |
| 2005/0243262 | A1* | 11/2005 | Kim | G02F 1/13394 |
| | | | | 349/156 |
| 2009/0323007 | A1* | 12/2009 | Shim | G02F 1/13394 |
| | | | | 349/155 |
| 2011/0013131 | A1* | 1/2011 | Tanaka | G02F 1/133512 |
| | | | | 349/155 |
| 2012/0138653 | A1* | 6/2012 | Kim | B26F 3/002 |
| | | | | 225/2 |
| 2015/0316808 | A1 | 11/2015 | Hirato et al. | |
| 2015/0362782 | A1* | 12/2015 | Miao | G02F 1/13394 |
| | | | | 349/156 |
| 2016/0139441 | A1* | 5/2016 | Hirato | G02F 1/1339 |
| | | | | 349/110 |

FOREIGN PATENT DOCUMENTS

| | | |
|---|---|---|
| CN | 100376937 C | 3/2008 |
| CN | 101315506 A | 12/2008 |
| CN | 101699336 | 4/2010 |
| CN | 101699336 A | 4/2010 |
| CN | 101806974 A | 8/2010 |
| CN | 102799017 A | 11/2012 |
| CN | 104871080 | 8/2015 |
| CN | 104871080 A | 8/2015 |
| CN | 105093709 A | 11/2015 |
| JP | 2011112892 A | 6/2011 |
| KR | 20040004857 A | 1/2004 |
| KR | 20080048333 A | 6/2008 |
| KR | 1020080048333 | 6/2008 |
| KR | 20130039383 A | 4/2013 |

OTHER PUBLICATIONS

International Preliminary Report on Patentability received for PCT Patent Application No. PCT/CN2016/076132, dated Mar. 29, 2018, 14 pages (9 pages of English Translation and 5 pages of Original Document).
International Search Report and Written Opinion in PCT/CN2016/076132 dated Jun. 13, 2016, with English translation. 16 pages.
Office Action in Chinese Application No. 201510586958.8 dated Aug. 3, 2017, with English translation.
"Third office action," CN Application No. 201510586958.8 (dated May 28, 2018).

* cited by examiner

DISPLAY PANEL AND MANUFACTURING METHOD THEREOF

RELATED APPLICATIONS

The present application is the U.S. national phase entry of PCT/CN2016/076132, with an international filing date of Mar. 11, 2016, which claims the benefit of Chinese Patent Applications No. 201510586958.8, filed on Sep. 15, 2015, the entire disclosures of which are incorporated herein by reference.

FIELD

The present disclosure relates to the field of display panel technologies, and particularly to a display panel and a manufacturing method thereof.

BACKGROUND

A liquid crystal display comprises pixel units designed in a matrix form, and a driving circuit for driving these pixel units. The deflection of liquid crystal molecules is achieved by means of change in the electric field in the liquid crystal cell, thereby achieving the display effect.

TFT-LCD is an active semiconductor device. Its display principle is to convert incident light emitted from the backlight into linearly polarized light by means of a first polarizer, which polarized light passes through a liquid crystal cell formed by attaching two layers of glass and injecting liquid crystal therebetween, and is emitted via a second polarizer. The liquid crystal has an optical birefringence property and would generate optical retardation for different incident light or different vibration directions, thereby changing the polarization state of the incident light. Since the liquid crystal molecules are arranged in different manners under different electric field intensities, the amounts of optical retardation generated are different, the polarization states of the incident light arriving at the second polarizer are different, and the intensities of the exit light are also different, such that the brightness of the exit light is adjusted by different liquid crystal electric field intensities and display of different gray scales is formed.

Typically, a pillar-shaped spacer (PS) is provided between the array substrate and the color film substrate in a liquid crystal display panel. The current design of PS is classified into PS on TFT and PS on Gate in terms of the position of PS, wherein the PS on Gate is further divided into PS on Gate with pillow-shaped spacer and PS on Gate without pillow-shaped spacer; and is generally classified into main PS and sub PS in terms of the height of PS, wherein the height of the main PS is relatively high and plays the role of static support in cell alignment of the array substrate and the color film substrate to ensure that the cell gap between the array substrate and the color film substrate reaches a design value, and the height of the sub PS is lower than that of the main PS and used for maintaining the cell gap when the liquid crystal cell is subjected to a vertical pressure and the main PS is heavily compressed.

The brightness of the dark state (L0 gray scale) is an important indicator of a TFT-LCD product. If the brightness of the dark state is high, it affects the contrast of the product, and in severe cases the picture cannot be normally viewed. Thus, to reduce light leakage in the dark state is a major issue of design of the TFT-LCD product.

In addition to the layout design and circuit design of the TFT-LCD, a further important cause for light leakage in the dark state is additional optical retardation resulting from deformation of glass when the liquid crystal screen is subjected to an external force (which may be an interference caused by design mismatch or imprecise manufacture of the mechanism, forming a local external force; and may be an external force applied on the liquid crystal screen), which changes the polarization state of the incident light passing through the liquid crystal cell in a normal state, thereby causing light leakage. In particular, for a notebook computer and a TPC product, this undesirable phenomenon becomes more common and obvious since they often need to be locally applied with an external force in use (for example, during the opening and closing process of the notebook computer).

According to the theory of photoelasticity, even if glass is an isotropic material, an anisotropic phenomenon would also take place therein under the effect of external force, that is, the refractive indexes under different stress states are not the same. The refractive index of a photoelastic material at a certain point is directly related to the stress state of this point. For a liquid crystal display, the stress is mainly caused by the frictional force between the PS and the array substrate, the magnitude of which is directly proportional to the friction coefficients and the contact area of the PS and the array substrate. The increase in stress results in birefringence of glass and the resulting optical retardation is directly proportional to the magnitude of stress and the thickness of glass.

In the prior art, in order to reduce the light leakage caused by the additional optical retardation of glass, an effective improvement method is to reduce the thickness of glass. However, too thin glass cannot be used directly on the high-generation TFT-LCD production line. Using thinning technology would further cause problems including complex process, rising cost and pressure in environmental protection.

In addition, since the designed density of the main PSs is relatively low, when they are subjected to an external force, a great internal stress is generated at local points inside the glass, resulting in obvious light leakage. In contrast, since the designed density of the sub PSs is very high and present in almost every pixel, when an external force is applied, the substrate bears the force uniformly and disperses the stress, not causing light leakage and whitening. Experiments prove that the light leakage and whitening are mainly caused by an internal stress of glass resulting from the friction between the main PSs and the array substrate under the effect of external force. When a TFT-LCD product is subjected to an external force, the glass is deformed to generate an internal stress and thereby produce additional optical retardation, resulting in light leakage in the dark state. In severe cases, the whole screen is whitened so that the picture cannot be normally viewed.

In conclusion, in the prior art, the friction between the pillar-shaped spacer and the array substrate of the display panel is increased under the effect of internal stress, thereby the amount of additional optical retardation is increased, resulting in the phenomenon of light leakage in the display panel in the dark state.

SUMMARY

Embodiments of the present disclosure provide a display panel and a manufacturing method thereof, which can at least alleviate or eliminate one or more of the above problems existing in the prior art.

An aspect of the present disclosure provides a display panel. The display panel comprises an array substrate and a color film substrate arranged in cell alignment, a pillar-shaped spacer located between the array substrate and the color film substrate and connected to the color film substrate, and a thin film transistor located on the array substrate.

The pillar-shaped spacer is in contact with the thin film transistor, and a surface of the pillar-shaped spacer that is in contact with the thin film transistor is a curved surface.

Alternatively, the array substrate further comprises a pillow-shaped spacer, a surface of the pillow-shaped spacer that is in contact with the pillar-shaped spacer is a curved surface, and/or a surface of the pillar-shaped spacer that is in contact with the pillow-shaped spacer is a curved surface.

In the display panel provided by embodiments of the present disclosure, the contact area between the pillar-shaped spacer and the thin film transistor or between the pillar-shaped spacer and the pillow-shaped spacer is reduced by designing the surface of the pillar-shaped spacer that is in contact with the thin film transistor as a curved surface; or designing at least one of the surface of the pillar-shaped spacer that is in contact with the pillow-shaped spacer and the surface of the pillow-shaped spacer that is in contact with the pillar-shaped spacer as a curved surface. Consequently, when the display panel is subjected to a horizontal force, the frictional force between the pillar-shaped spacer and the thin film transistor or between the pillar-shaped spacer and the pillow-shaped spacer is reduced, thereby reducing the amount of additional optical retardation, achieving the purpose of avoiding the phenomenon of light leakage in the display panel in the dark state.

Optionally, the curved surface of the pillar-shaped spacer is a protrusion towards the thin film transistor or the pillow-shaped spacer, and the curved surface of the pillow-shaped spacer is a protrusion towards the pillar-shaped spacer.

By designing the curved surface of the pillar-shaped spacer or the pillow-shaped spacer as a protrusion, the contact area becomes a point, thereby achieving the purpose of reducing the contact area between the pillar-shaped spacer and the thin film transistor or the pillow-shaped spacer. When the display panel is subjected to a horizontal force, the frictional force between the pillar-shaped spacer and the thin film transistor or the pillow-shaped spacer is reduced, thereby reducing the amount of additional optical retardation and achieving the purpose of avoiding the phenomenon of light leakage in the display panel in the dark state.

Optionally, the curved surface of the pillar-shaped spacer is hemispherical, wavy or zigzag, and the curved surface of the pillow-shaped spacer is hemispherical, wavy, or zigzag.

Optionally, the pillow-shaped spacer comprises an active layer, an ohmic contact layer on the active layer, a source/drain metal layer on the ohmic contact layer, and a passivation layer on the source/drain metal layer, wherein the passivation layer has a curved surface; or the source/drain metal layer and the passivation layer both have curved surfaces with a same radian; or the ohmic contact layer, the source/drain metal layer and the passivation layer all have curved surfaces with a same radian.

Optionally, the pillow-shaped spacer comprises a source/drain metal layer and a passivation layer on the source/drain metal layer, wherein the passivation layer has a curved surface; or the source/drain metal layer and the passivation layer both have curved surfaces with a same radian.

Optionally, the pillow-shaped spacer only comprises a passivation layer having a curved surface.

Optionally, there are a plurality of pillow-shaped spacers which are in contact with one and the same pillar-shaped spacer.

By bringing the plurality of pillow-shaped spacers into contact with one pillar-shaped spacer, the amount of offset between the pillar-shaped spacer and the plurality of pillow-shaped spacers is reduced, thereby preventing decrease in the distance between the array substrate and the color film substrate.

Another aspect of the present disclosure provides a method of manufacturing a display panel provided by the present disclosure. The method comprises: after forming a transparent electrically conductive layer in a color film substrate, forming a pillar-shaped spacer on the transparent electrically conductive layer, and making a surface of a pillar top of the pillar-shaped spacer a curved surface; or at the time of forming a pillow-shaped spacer in an array substrate, making an upper surface of the pillow-shaped spacer a curved surface.

In the method of manufacturing a display panel as provided by embodiments of the present disclosure, after a transparent electrically conductive layer in the color film substrate is formed, a pillar-shaped spacer is formed and the surface of the pillar top of the pillar-shaped spacer is made into a curved surface, such that the curved surface of the pillar-shaped spacer is in contact with the pillow-shaped spacer or the thin film transistor of the array substrate, and the region where they are in contact with each other becomes a point or a line, which consequently reduces the contact area between the pillar-shaped spacer and the pillow-shaped spacer or the thin film transistor and further reduces the frictional force between the pillar-shaped spacer and the array substrate, reducing the amount of additional optical retardation and avoiding the phenomenon of light leakage in the display panel in the dark state.

Alternatively, the surface of the pillow-shaped spacer which is in contact with the pillar-shaped spacer is designed as a curved surface so that the area of the pillow-shaped spacer that is in contact with the pillar-shaped spacer is reduced. Consequently, when the display panel is subjected to a shearing force in the horizontal direction, the pillar-shaped spacer slides along the raised portion of the curved surface such that the frictional force between the pillar-shaped spacer and the pillow-shaped spacer is reduced, thereby reducing the amount of additional optical retardation and avoiding the phenomenon of light leakage in the display panel. Meanwhile, since the design process of the pillow-shaped spacer or the pillar-shaped spacer does not involve addition of a mask, the production cost of the display panel is not increased.

Optionally, at the time of forming a pillow-shaped spacer in an array substrate, making an upper surface of the pillow-shaped spacer a curved surface comprises: at the time of forming a source/drain metal layer of a thin film transistor in the array substrate, forming a source/drain metal layer having a curved surface in a non-thin film transistor region of the array substrate; at the time of forming a passivation layer on the source/drain metal layer, forming, on the source/drain metal layer having a curved surface, a passivation layer having a curved surface with a same radian with that of the curved surface of the source/drain metal layer; or, at the time of forming a source/drain metal layer of a thin film transistor in the array substrate, forming a source/drain metal layer in a non-thin film transistor region of the array substrate; at the time of forming a passivation layer on the source/drain metal layer, forming a passivation layer having a curved surface on the source/drain metal layer in the non-thin film transistor region of the array substrate.

Optionally, at the time of forming a source/drain metal layer of a thin film transistor in the array substrate, prior to forming a source/drain metal layer having a curved surface in a non-thin film transistor region of the array substrate, the method further comprises: at the time of forming an active layer of a thin film transistor in the array substrate, forming an active layer in a non-thin film transistor region of the array substrate; at the time of forming an ohmic contact layer on the active layer, forming an ohmic contact layer having a curved surface on the active layer in the non-thin film transistor region.

DETAILED DESCRIPTION

To make the objective, technical solutions and advantages of the present disclosure clearer, the present disclosure will be further described below in detail with reference to the drawings. Apparently, the embodiments described are just a part of the embodiments of the present disclosure rather than all of them. All other embodiments obtained by those ordinarily skilled in the art based on the embodiments in the present disclosure without spending inventive efforts fall within the protection scope of the present disclosure.

Figure 1:
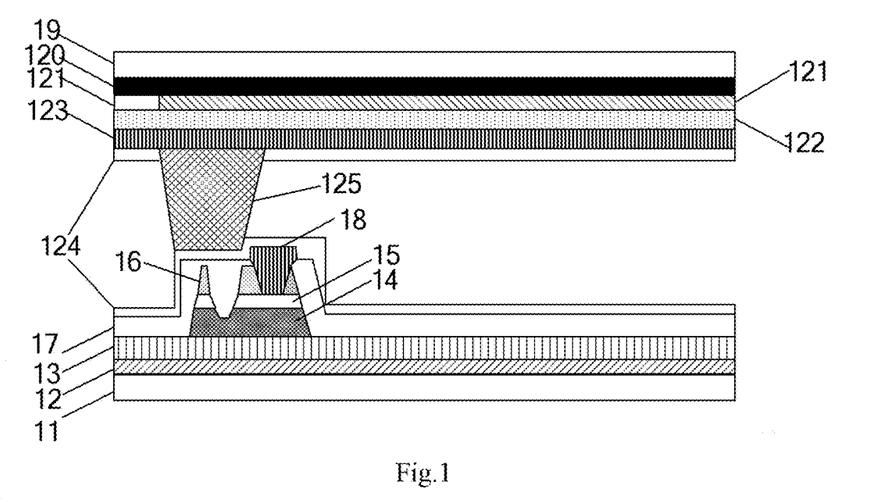
FIG. 1 is a structural schematic view of a display panel provided by the prior art.

Referring to FIG. 1 which is a schematic sectional view of PS design in a TFT-LCD where the PS is located on the TFT of the array substrate, the structure of the display panel comprises a glass substrate 11 in the array substrate, a gate line 12, a gate insulating layer 13, an active layer (including amorphous silicon A-Si) 14, an ohmic contact layer 15, a source/drain (SD) metal layer 16, a passivation layer 17, a transparent electrically conductive layer (ITO) 18 on the array substrate side, a glass substrate 19 in the color film (CF) substrate, a black matrix (BM) pattern 120, a color cell pattern 121, a planarization layer 122, a transparent electrically conductive layer 123 on the color film substrate side, an alignment layer 124, and a pillar-shaped spacer 125, wherein the pillar-shaped spacer 125 has a large contact area with the alignment layer 124 in the array substrate.

Figure 2:
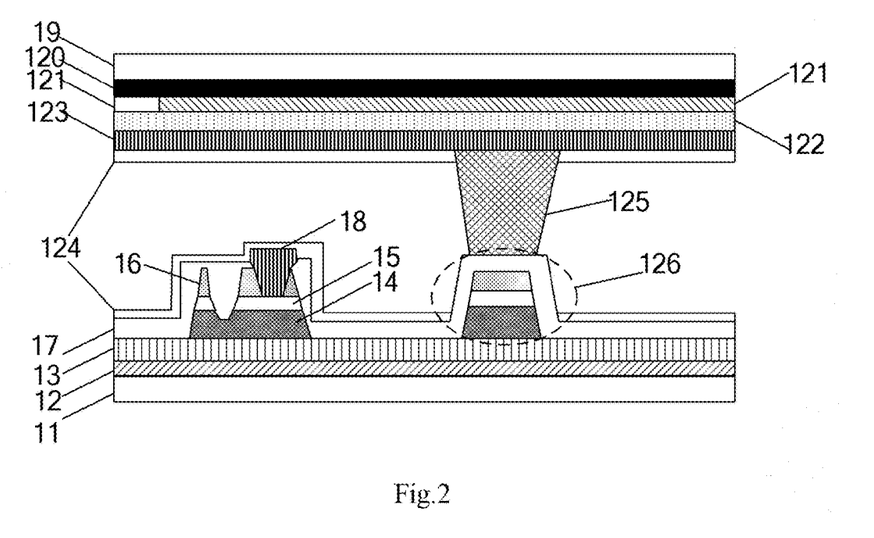
FIG. 2 is a structural schematic view of another display panel provided by the prior art.
Figure 3:
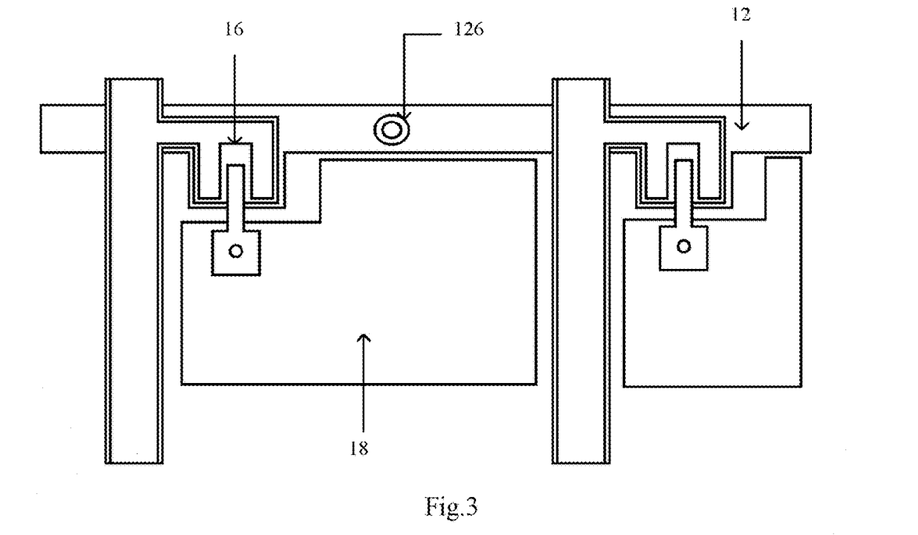
FIG. 3 is a schematic plan view of the display panel shown in FIG. 2.

Referring to FIG. 2 which is a schematic sectional view of a TFT-LCD where the PS is located on a pillow-shaped spacer of the array substrate, the structure of the display panel comprises a glass substrate 11 in the array substrate, a gate line 12, a gate insulating layer 13, an active layer (including amorphous silicon A-Si) 14, an ohmic contact layer 15, a source/drain metal layer 16, a passivation layer 17, a transparent electrically conductive layer (ITO) 18 on the array substrate side, a glass substrate 19 in the color film substrate, a BM pattern 120, a color cell pattern 121, a planarization layer 122, a transparent electrically conductive layer 123 on the color film substrate side, an alignment layer 124, and a pillar-shaped spacer 125, wherein the pillar-shaped spacer 125 is in contact with a pillow-shaped spacer 126 in a non-thin film transistor region in the array substrate. The pillow-shaped spacer 126 comprises an active layer (including amorphous silicon A-Si) 14 located in the non-thin film transistor region, an ohmic contact layer 15, a source/drain metal layer 16, and a passivation layer 17. It can be seen from FIG. 2 that the pillow-shaped spacer 126 has a large contact area with the pillar-shaped spacer 125. Therefore, when a shearing force is applied on the TFT-LCD, the frictional force between the pillow-shaped spacer 126 and the pillar-shaped spacer 125 is large, so that the glass substrate in the array substrate is deformed, thereby increasing additional optical retardation, resulting in light leakage in the dark state. FIG. 3 is a schematic plan view of FIG. 2, which shows a gate line 12, a source/drain metal layer 16, a transparent electrically conductive layer (ITO) 18 on the array substrate side, and a pillow-shaped spacer 126.

The present disclosure provides a display panel and a manufacturing method thereof to reduce the frictional force between the pillar-shaped spacer and the array substrate, thereby reducing the amount of additional optical retardation and avoiding the phenomenon of light leakage in the display panel in the dark state.

It is to be noted that main pillar-shaped spacers (Main PS) and sub pillar-shaped spacers (Sub PS) are provided between the color film substrate and the array substrate. Since the density of the main pillar-shaped spacers is low, when they are subjected to an external force, a great internal stress is generated at local points inside the array substrate, thereby resulting in great light leakage. On the other hand, since the density of the sub pillar-shaped spacers is high, when they are subjected to an external force, the array substrate bears the force uniformly, not prone to the light leakage and whitening phenomenon. Thus, the pillar-shaped spacers used throughout the embodiments of the present disclosure all refer to main pillar-shaped spacers in the display panel, unless otherwise specified.

The display panel in embodiments of the present disclosure is applicable to various liquid crystal display products involving ADS liquid crystal display panel, in-plane switching (IPS) liquid crystal display panel, a twisted nematic (TN) display panel, a multi-domain vertical alignment (MVA) liquid crystal display panel, etc, but is not limited thereto.

It is to be noted that the thicknesses of respective film layers and the sizes and shapes of regions in the drawings do not reflect the real-life ratios of the components of the thin film transistor and the array substrate, which are only used to illustrate the present disclosure.

Figure 4:
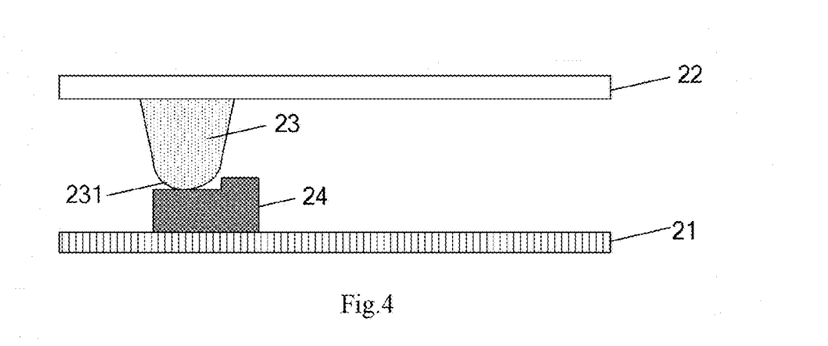
FIG. 4 is a schematic structural view of a display panel provided by embodiments of the present disclosure.

Referring to FIG. 4, a display panel provided by embodiments of the present disclosure comprises an array substrate 21 and a color film substrate 22 arranged in cell alignment, a pillar-shaped spacer 23 located between the array substrate 21 and the color film substrate 22 and connected to the color film substrate 22, and a thin film transistor 24 on the array substrate 21, wherein the pillar-shaped spacer 23 is in contact with the thin film transistor 24 and a surface 231 of the pillar-shaped spacer 23 which is in contact with the thin film transistor 24 is a curved surface.

Figure 5:
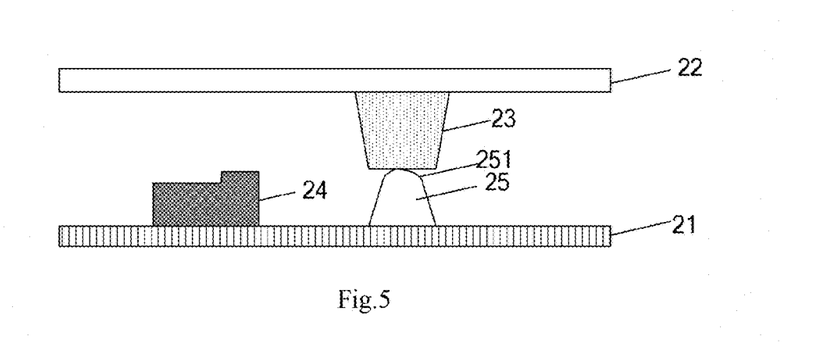
FIG. 5 is a schematic structural view of another display panel provided by embodiments of the present disclosure.

Alternatively, referring to FIG. 5, the array substrate 21 further comprises a pillow-shaped spacer 25, wherein a surface 251 of the pillow-shaped spacer 25 which is in contact with the pillar-shaped spacer 23 is a curved surface.

Figure 6:
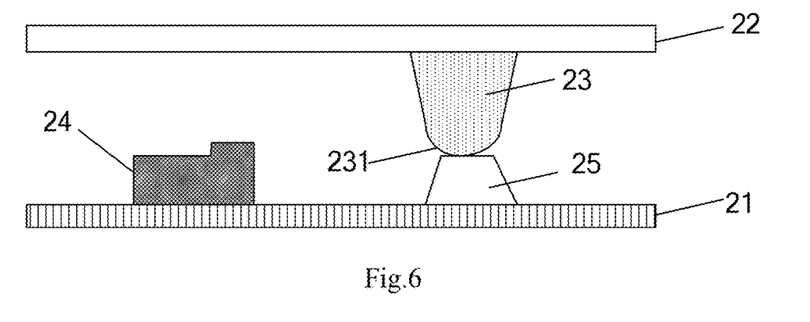
FIG. 6 is a schematic structural view of a further display panel provided by embodiments of the present disclosure.

Alternatively, referring to FIG. 6, a surface 231 of the pillar-shaped spacer 23 which is in contact with the pillow-shaped spacer 25 is a curved surface.

It is to be noted that FIGS. 4, 5 and 6 only show a schematic sectional view in which the surface 231 of the pillar-shaped spacer is a curved surface, and a schematic sectional view in which the surface 251 of the pillow-shaped spacer is a curved surface, wherein the pillar-shaped spacer is a cylinder or a cuboid or in other shape, but the surface where it is in contact with the thin film transistor or the pillow-shaped spacer may be any curved surface, i.e. the surface of the pillar top of pillar-shaped spacer may be hemispherical or wavy or zigzag. Similarly, the upper surface 251 of the pillow-shaped spacer may also be hemispherical, wavy or zigzag. In addition, the curved surface in the present disclosure is non-planar such that the contact area between the curved surface and the plane can be approximated as a point or a line, thereby reducing the contact area.

In the display panel provided by embodiments of the present disclosure, the contact area between the pillar-shaped spacer and the thin film transistor or between the pillar-shaped spacer and the pillow-shaped spacer is reduced by designing the surface of the pillar-shaped spacer that is in contact with the thin film transistor as a curved surface; or designing at least one of the surface of the pillar-shaped spacer that is in contact with the pillow-shaped spacer and the surface of the pillow-shaped spacer that is in contact with the pillar-shaped spacer as a curved surface. Consequently, when the display panel is subjected to a horizontal force, the frictional force between the pillar-shaped spacer and the thin film transistor or between the pillar-shaped spacer and the pillow-shaped spacer is reduced, thereby reducing the amount of additional optical retardation, achieving the purpose of avoiding the phenomenon of light leakage in the display panel in the dark state.

In one embodiment, referring to FIGS. 4 and 6, the curved surface 231 of the pillar-shaped spacer is a protrusion towards the thin film transistor or the pillow-shaped spacer. In another embodiment, referring to FIG. 5, the curved surface 251 of the pillow-shaped spacer is a protrusion towards the pillar-shaped spacer.

The curved surface 231 of the pillar-shaped spacer is actually in a hemispherical shape and the curved surface 251 of the pillow-shaped spacer is also in a hemispherical shape such that point contact is achieved when the curved surface of the pillar-shaped spacer is in contact with the plane of the thin film transistor, thereby reducing the frictional force therebetween. Similarly, point contact is achieved when the curved surface of the pillow-shaped spacer is in contact with the plane or curved surface of the pillar-shaped spacer, thereby reducing the frictional force therebetween.

Figure 7:
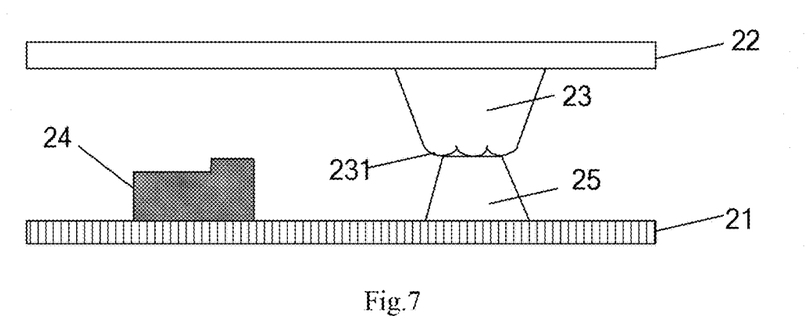
FIG. 7 is a schematic structural view of yet another display panel provided by embodiments of the present disclosure.
Figure 8:
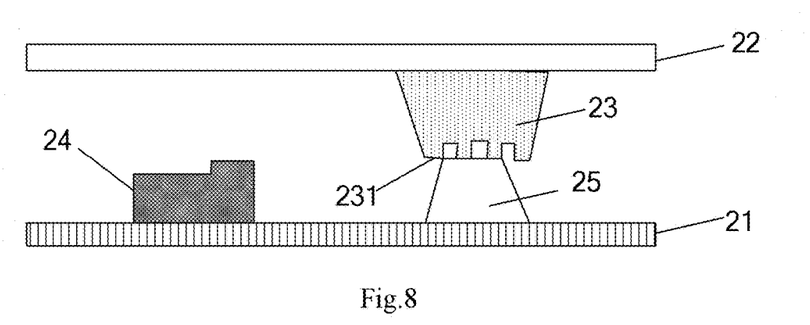
FIG. 8 is a schematic structural view of a display panel provided by embodiments of the present disclosure.

Of course, the present disclosure is not limited to designing the curved surface of the pillar-shaped spacer as one protrusion. The curved surface of one pillar-shaped spacer can be designed as a plurality of protrusions. Referring to FIG. 7, it shows a schematic sectional view in which the surface 231 of the pillar-shaped spacer has a plurality of protrusions. Referring to FIG. 8, the curved surface 231 of the pillar-shaped spacer can also be set to be zigzag. Likewise, the pillow-shaped spacer can be designed similarly to the curved surface of the pillar-shaped spacer.

By designing the curved surface of the pillar-shaped spacer or the pillow-shaped spacer as a protrusion, the contact area between the pillar-shaped spacer and the thin film transistor or the pillow-shaped spacer becomes a point, thereby reducing the contact area therebetween. Consequently, when a horizontal force is applied, the frictional force between the pillar-shaped spacer and the thin film transistor or the pillow-shaped spacer is reduced, thereby reducing the amount of additional optical retardation and achieving the purpose of avoiding the phenomenon of light leakage in the display panel in the dark state.

In general, the design of a pillar-shaped spacer includes PS on TFT and PS on Pillow. The design of a pillow-shaped spacer is described below in detail in the case of PS on Pillow.

Figure 9:
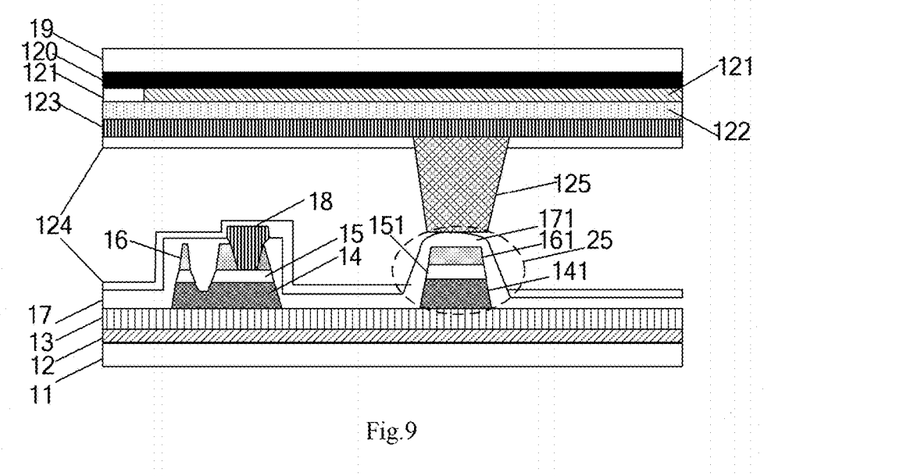
FIG. 9 is a schematic structural view of another display panel provided by embodiments of the present disclosure.

In one embodiment, referring to FIG. 9, a display panel provided by embodiments of the present disclosure comprises a glass substrate 11 in an array substrate, a gate line 12, a gate insulating layer 13, an active layer (including amorphous silicon A-Si) 14, an ohmic contact layer 15, a source/drain metal layer 16, a passivation layer 17, a transparent electrically conductive layer (ITO) 18 on the array substrate side, a glass substrate 19 in a color film substrate, a BM pattern 120, a color cell pattern 121, a planarization layer 122, a transparent electrically conductive layer 123 on the color film substrate side, an alignment layer 124, and a pillar-shaped spacer 125. The pillar-shaped spacer 125 may be a pillar-shaped spacer 23 having protrusions as provided in embodiments of the present disclosure, and may also be a pillar-shaped spacer 125 having no protrusions in the prior art. FIG. 9 only illustrates the pillar-shaped spacer having no protrusions, but is not limited thereto. In addition, FIG. 9 further comprises a pillow-shaped spacer 25, and the pillow-shaped spacer 25 comprises an active layer 141, an ohmic contact layer 151 on the active layer, a source/drain metal layer 161 on the ohmic contact layer, and a passivation layer 171 on the source/drain metal layer, wherein the passivation layer 171 has a curved surface.

Figure 10:
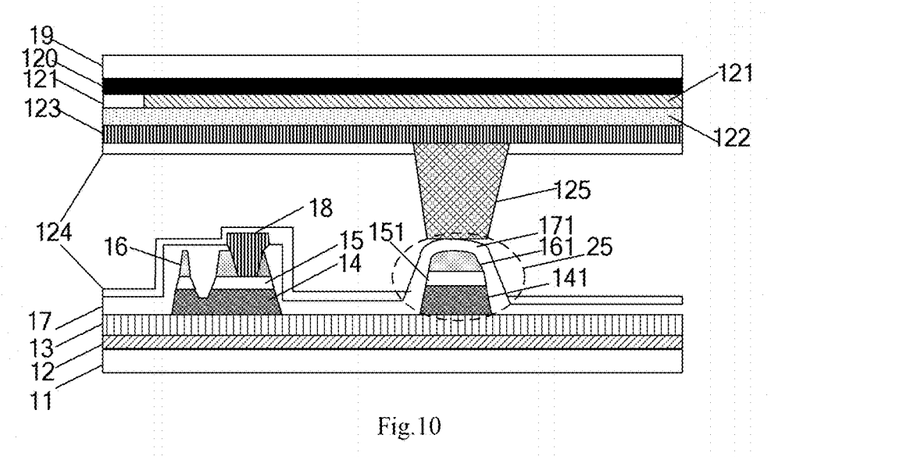
FIG. 10 is a schematic structural view of a further display panel provided by embodiments of the present disclosure.

In another embodiment, referring to FIG. 10, the passivation layer 171 and the source/drain metal layer 161 both have curved surfaces with the same radian.

Figure 11:
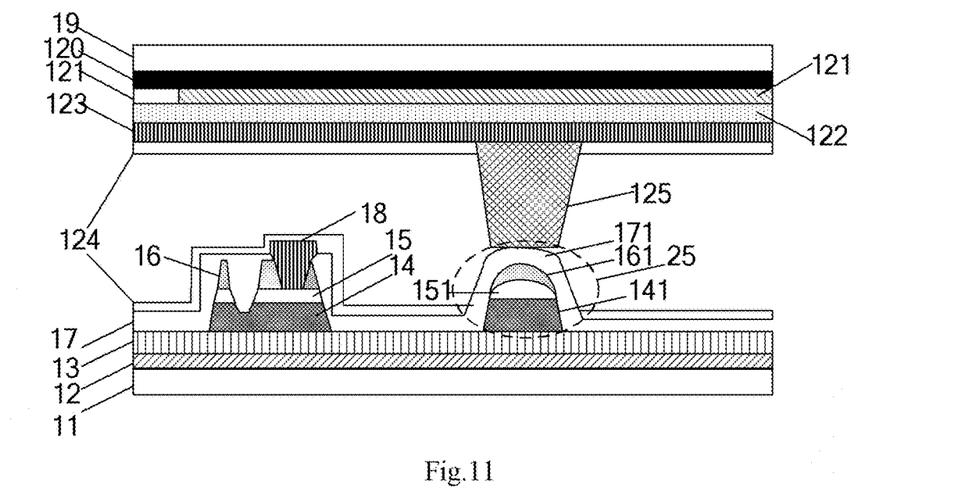
FIG. 11 is a schematic structural view of yet another display panel provided by embodiments of the present disclosure.

In a further embodiment, referring to FIG. 11, the ohmic contact layer 151, the source/drain metal layer 161 and the passivation layer 171 all have curved surfaces with the same radian.

By designing one or more of the ohmic contact layer, the source/drain metal layer and the passivation layer as having a curved surface, the pillow-shaped spacer is designed to have a raised hemispheric shape so that when it is in contact with a plane or curved surface, the contact area between the two surfaces is reduced, thus the frictional force between the pillow-shaped spacer and the pillar-shaped spacer is reduced.

In a further embodiment, the pillow-shaped spacer 25 comprises a source/drain metal layer 161 and a passivation layer 171 on the source/drain metal layer, wherein the passivation layer 171 has a curved surface. Alternatively, both the source/drain metal layer 161 and the passivation layer 171 have curved surfaces with the same radian.

Figure 12:
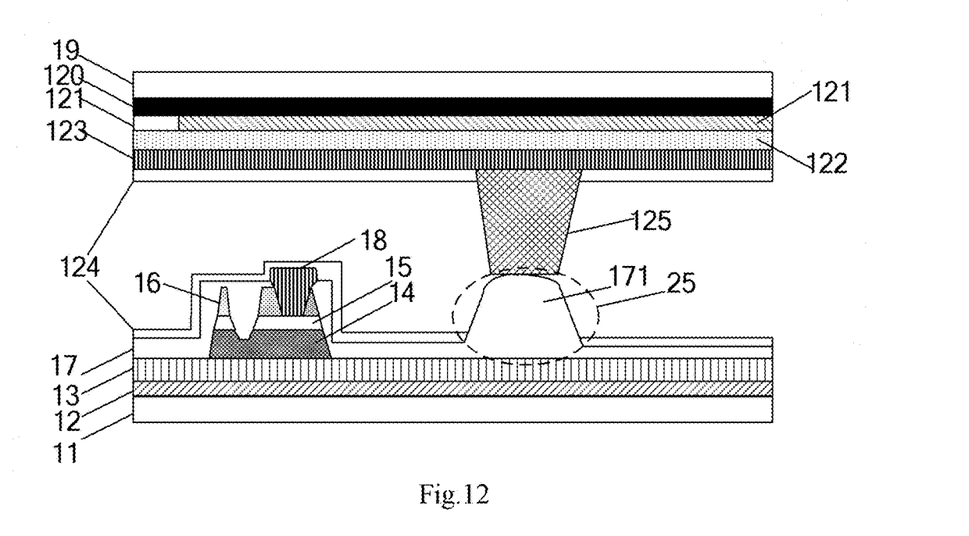
FIG. 12 is a schematic structural view of a display panel provided by embodiments of the present disclosure.

In one embodiment, referring to FIG. 12, the pillow-shaped spacer 25 includes only a passivation layer 171 with a curved surface.

When the pillow-shaped spacer is only composed of the passivation layer, it is required to increase the thickness of film during the formation of the passivation layer so as to enhance the radian effect of the passivation layer, exhibiting a structure in which the passivation layer has a curved surface.

In another embodiment, each sub-pixel in the display panel comprises a plurality of pillow-shaped spacers which are in contact with one and the same pillar-shaped spacer.

Figure 13:
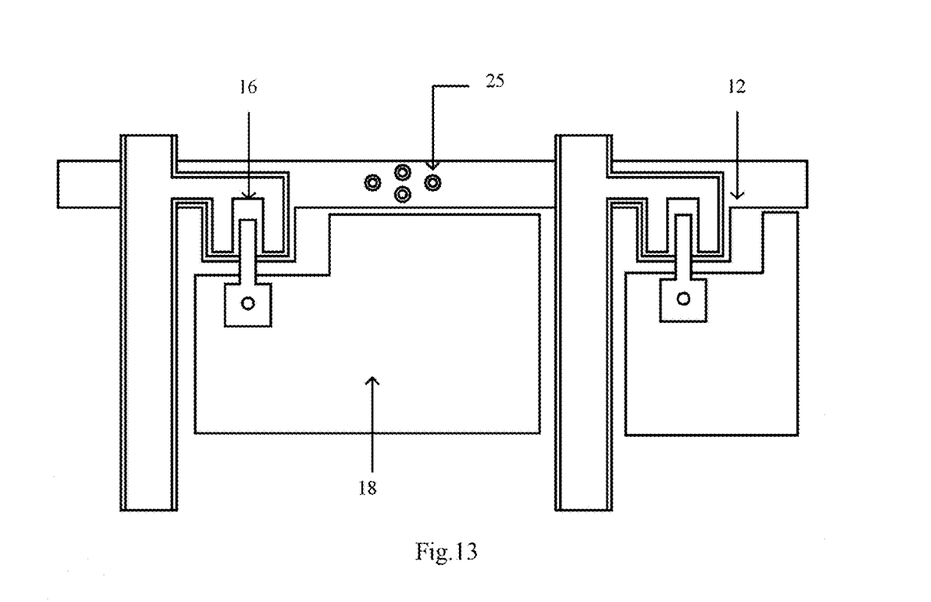
FIG. 13 is a schematic plan view of another display panel provided by embodiments of the present disclosure.

For example, referring to FIG. 13, each sub-pixel comprises four pillow-shaped spacers 25 which correspond to one pillar-shaped spacer, wherein a gate line 12, a source/drain metal layer 16, and a transparent electrically conductive layer (ITO) 18 on the array substrate side are further shown.

By bringing a plurality of pillow-shaped spacers into contact with one pillar-shaped spacer, the amount of offset between the pillar-shaped spacer and the plurality of pillow-shaped spacers is reduced, thereby preventing decrease in the distance between the array substrate and the color film substrate.

In summary, in the display panel provided by embodiments of the present disclosure, for a PS on TFT display panel, the surface of the pillar-shaped spacer which is in contact with the thin film transistor is designed as a curved surface, for example, the curved surface of the pillar-shaped spacer is a protrusion towards the thin film transistor, such that the contact area between the pillar-shaped spacer and the thin film transistor is reduced when they are in contact with each other. Consequently, when the display panel is subjected to a shearing force in the horizontal direction, the pillar-shaped spacer slides along the position of the protrusion such that the frictional force between the pillar-shaped spacer and the thin film transistor is reduced, thereby reducing the amount of additional optical retardation and avoiding the phenomenon of light leakage in the display panel in the dark state. For a PS on Pillow display panel, the surface of the pillar-shaped spacer which is in contact with the pillow-shaped spacer is designed as a curved surface, for example, the curved surface of the pillar-shaped spacer is a protrusion towards the pillow-shaped spacer, and/or the surface of the pillow-shaped spacer which is in contact with the pillar-shaped spacer is designed as a curved surface, for example, the curved surface of the pillow-shaped spacer is a protrusion towards the pillar-shaped spacer. Consequently, when the display panel is subjected to a shearing force in the horizontal direction, the pillar-shaped spacer slides along the position of the protrusion such that the frictional force between the pillar-shaped spacer and the pillow-shaped spacer is reduced, thereby reducing the amount of additional optical retardation and avoiding the phenomenon of light leakage in the display panel in the dark state.

Figure 14:
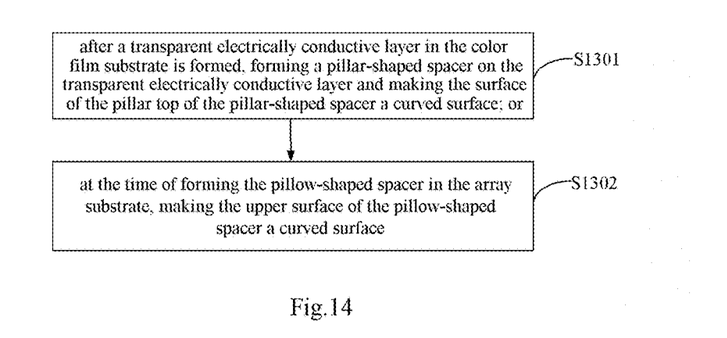
FIG. 14 is a flow chart of a method of manufacturing a display panel as provided by embodiments of the present disclosure.

Referring to FIG. 14, it schematically illustrates a method of manufacturing a display panel according to embodiments of the present disclosure, as provided by embodiments of the present disclosure. The method comprises: in step S1301, after a transparent electrically conductive layer in the color film substrate is formed, forming a pillar-shaped spacer on the transparent electrically conductive layer and making the surface of the pillar top of the pillar-shaped spacer a curved surface; or in step S1302, at the time of forming the pillow-shaped spacer in the array substrate, making the upper surface of the pillow-shaped spacer a curved surface.

It is to be noted that the surface of the pillar top of the pillar-shaped spacer refers to the surface of the pillar-shaped spacer facing the thin film transistor or the pillow-shaped spacer, wherein the curved surface may be raised or wavy or zigzag. The upper surface of the pillow-shaped spacer refers to the surface of the pillow-shaped spacer which is in contact with the pillar-shaped spacer.

In one embodiment, making the surface of the pillar top of the pillar-shaped spacer a curved surface comprises: after the transparent electrically conductive layer is formed, forming a pillar-shaped spacer having a protrusion by exposure, development and etching process in a region on the transparent electrically conductive layer where the pillar-shaped spacer needs to be arranged.

In the method of manufacturing a display panel as provided by embodiments of the present disclosure, after a transparent electrically conductive layer in the color film substrate is formed, a pillar-shaped spacer is formed and the surface of the pillar top of the pillar-shaped spacer is made into a curved surface, such that the curved surface of the pillar-shaped spacer is in contact with the pillow-shaped spacer or the thin film transistor of the array substrate, and the region where they are in contact with each other becomes a point or a line, which consequently reduces the contact area between the pillar-shaped spacer and the pillow-shaped spacer or the thin film transistor and further reduces the frictional force between the pillar-shaped spacer and the array substrate, reducing the amount of additional optical retardation and avoiding the phenomenon of light leakage in the display panel in the dark state.

Alternatively, the surface of the pillow-shaped spacer which is in contact with the pillar-shaped spacer is designed as a curved surface so that the area of the pillow-shaped spacer that is in contact with the pillar-shaped spacer is reduced. Consequently, when the display panel is subjected to a shearing force in the horizontal direction, the pillar-shaped spacer slides along the raised portion of the curved surface such that the frictional force between the pillar-shaped spacer and the pillow-shaped spacer is reduced, thereby reducing the amount of additional optical retardation and avoiding the phenomenon of light leakage in the display panel.

In the above embodiments, since the design process of the pillow-shaped spacer or the pillar-shaped spacer does not involve addition of a mask, the production cost of the display panel is not increased.

In another embodiment, in step S1302, at the time of forming the pillow-shaped spacer in the array substrate, making the upper surface of the pillow-shaped spacer a curved surface comprises: at the time of forming a source/drain metal layer of the thin film transistor in the array substrate, forming a source/drain metal layer having a curved surface in a non-thin film transistor region of the array substrate; at the time of forming a passivation layer on the source/drain metal layer, forming, on the source/drain metal layer having a curved surface, a passivation layer having a curved surface with the same radian with that of the curved surface of the source/drain metal layer; or, at the time of forming a source/drain metal layer of the thin film transistor in the array substrate, forming a source/drain metal layer in a non-thin film transistor region of the array substrate; at the time of forming a passivation layer on the source/drain metal layer, forming a passivation layer having a curved surface on the source/drain metal layer in the non-thin film transistor region of the array substrate.

It is to be noted that the non-thin film transistor region of the array substrate refers to a region which is located in the region in the array substrate to which the light blocking region of the color film substrate corresponds and is located in the vertical projection region where the gate lines are located. That is, the non-thin film transistor region in the present disclosure is a region in which a pillow-shaped spacer is generally provided.

In one embodiment, at the time of forming a source/drain metal layer of the thin film transistor in the array substrate, prior to forming a source/drain metal layer having a curved surface in the non-thin film transistor region of the array substrate, the method further comprises: at the time of forming an active layer of the thin film transistor in the array substrate, forming an active layer in the non-thin film transistor region of the array substrate; at the time of forming an ohmic contact layer on the active layer, forming an ohmic contact layer having a curved surface on the active layer in the non-thin film transistor region.

The process and principle of forming the ohmic contact layer, the source/drain metal layer, the active layer and the passivation layer in the present disclosure are the same as those in the prior art and will not be described herein. The present disclosure differs in forming each layer or any layer into a layer having a protrusion by different degrees of exposure, development and etching, thereby forming an ohmic contact layer, a source/drain metal layer and a passivation layer which are exposed to different degrees distributed in a gradient.

In general, the prior art reduces the thickness of glass of the display panel in order to reduce the amount of additional optical retardation, but this requires adding the thinning process, which increases the production cost of the product and is unfavorable to environmental protection. In embodiments of the present disclosure, however, when a pillow-shaped spacer or a pillar-shaped spacer is fabricated, a pillow-shaped spacer or a pillar-shaped spacer having a curved surface is formed by different degrees of exposure, development and etching, thereby reducing the amount of additional optical retardation and avoiding the phenomenon of light leakage in the display panel in the dark state without increasing the cost of the product.

It is to be noted that the structure of the pillow-shaped spacer provided in embodiments of the present disclosure is merely an exemplary embodiment and is not limited thereto. The pillow-shaped spacer is not limited to having any one or several of an active layer, an ohmic contact layer, a source/drain metal layer and a passivation layer. In practice, the number of layers or the structure of the pillow-shaped spacer can be designed based on actual needs. In addition, the number of the pillow-shaped spacers is not particularly limited in embodiments of the present disclosure. All design concepts for reducing the contact area between the pillow-shaped spacer and the pillar-shaped spacer or the contact area between the pillar-shaped spacer and the thin film transistor fall within the protection scope of the present disclosure.

In conclusion, in the display panel provided by embodiments of the present disclosure, for a PS on TFT display panel, the surface of the pillar-shaped spacer which is in contact with the thin film transistor is designed as a curved surface, for example, the curved surface of the pillar-shaped spacer is a protrusion towards the thin film transistor, such that the contact area between the pillar-shaped spacer and the thin film transistor is reduced when they are in contact with each other. Consequently, when the display panel is subjected to a shearing force in the horizontal direction, the pillar-shaped spacer slides along the position of the protrusion such that the frictional force between the pillar-shaped spacer and the thin film transistor is reduced, thereby reducing the amount of additional optical retardation and avoiding the phenomenon of light leakage in the display panel in the dark state. For a PS on Pillow display panel, the surface of the pillar-shaped spacer which is in contact with the pillow-shaped spacer is designed as a curved surface, for example, the curved surface of the pillar-shaped spacer is a protrusion towards the pillow-shaped spacer, and/or the surface of the pillow-shaped spacer which is in contact with the pillar-shaped spacer is designed as a curved surface, for example, the curved surface of the pillow-shaped spacer is a protrusion towards the pillar-shaped spacer. Consequently, when the display panel is subjected to a shearing force in the horizontal direction, the pillar-shaped spacer slides along the position of the protrusion such that the frictional force between the pillar-shaped spacer and the pillow-shaped spacer is reduced, thereby reducing the amount of additional optical retardation and avoiding the phenomenon of light leakage in the display panel in the dark state.

Apparently, those skilled in the art can make various modifications and variations to the present disclosure without departing from the spirit and scope thereof. In this way, if these modifications and variations to the present disclosure fall within the scope of the claims of the present disclosure and equivalence thereof, the present disclosure also intends to encompass these modifications and variations.

The invention claimed is:

1. A display panel comprising an array substrate and a color film substrate arranged in cell alignment, a pillar-shaped spacer located between the array substrate and the color film substrate and connected to the color film substrate, and a thin film transistor located on the array substrate, wherein, the array substrate further comprises a pillow-shaped spacer, at least one of a surface of the pillow-shaped spacer that is in contact with the pillar-shaped spacer and a surface of the pillar-shaped spacer that is in contact with the pillow-shaped spacer is a curved surface, and the pillow-shaped spacer comprises a passivation layer having a curved surface, the pillow-shaped spacer comprises an active layer, an ohmic contact layer on the active layer, a source/drain metal layer on the ohmic contact layer, and the passivation layer on the source/drain metal layer, and at least one of the ohmic contact layer and the source/drain metal layer has a curved surface, and the curved surface of the at least one of the ohmic contact layer and the source/drain metal layer has a same radian as that of the curved surface of the passivation layer.

2. The display panel according to claim 1, wherein the curved surface of the pillar-shaped spacer is a protrusion towards the thin film transistor or the pillow-shaped spacer, and the curved surface of the pillow-shaped spacer is a protrusion towards the pillar-shaped spacer.

3. The display panel according to claim 1, wherein the curved surface of the pillar-shaped spacer is hemispherical, wavy or zigzag, and the curved surface of the pillow-shaped spacer is hemispherical, wavy, or zigzag.

4. The display panel according to claim 1, wherein there are a plurality of pillow-shaped spacers which are in contact with one and a same pillar-shaped spacer.

5. A method of manufacturing a display panel according to claim 1, comprising:
   after forming a transparent electrically conductive layer in the color film substrate, forming the pillar-shaped spacer on the transparent electrically conductive layer, and making a surface of a pillar top of the pillar-shaped spacer a curved surface.

6. The method according to claim 5, wherein at the time of forming the pillow-shaped spacer in array substrate, making an upper surface of the pillow-shaped spacer a curved surface comprises:
   at the time of forming the source/drain metal layer of the thin film transistor in the array substrate, forming the source/drain metal layer in a non-thin film transistor region of the array substrate;
   at the time of forming the passivation layer on the source/drain metal layer, forming the passivation layer having a curved surface on the source/drain metal layer in the non-thin film transistor region of the array substrate.

7. The method according to claim 5, wherein the curved surface of the pillow-shaped spacer is a protrusion towards the pillar-shaped spacer.

8. The method according to claim 5, wherein the curved surface of the pillow-shaped spacer is hemispherical, wavy, or zigzag.

9. A display panel comprising an array substrate and a color film substrate arranged in cell alignment, a pillar-shaped spacer located between the array substrate and the color film substrate and connected to the color film substrate, and a thin film transistor located on the array substrate, wherein,
   the array substrate further comprises a pillow-shaped spacer, at least one of a surface of the pillow-shaped spacer that is in contact with the pillar-shaped spacer and a surface of the pillar-shaped spacer that is in contact with the pillow-shaped spacer is a curved surface, and the pillow-shaped spacer comprises a passivation layer having a curved surface,
   the pillow-shaped spacer comprises a source/drain metal layer and the passivation layer on the source/drain metal layer, and source/drain metal layer has a curved surface that has a same radian as that of the curved surface of the passivation layer.

10. The display panel according to claim 1, wherein the curved surface of the pillar-shaped spacer is a protrusion towards the thin film transistor or the pillow-shaped spacer, and the curved surface of the pillow-shaped spacer is a protrusion towards the pillar-shaped spacer.

11. The display panel according to claim 1, wherein the curved surface of the pillar-shaped spacer is hemispherical, wavy or zigzag, and the curved surface of the pillow-shaped spacer is hemispherical, wavy, or zigzag.

12. The display panel according to claim 1, wherein there are a plurality of pillow-shaped spacers which are in contact with one and a same pillar-shaped spacer.

13. A method of manufacturing a display panel according to claim 1, comprising:
   after forming a transparent electrically conductive layer in the color film substrate, forming the pillar-shaped spacer on the transparent electrically conductive layer, and making a surface of a pillar top of the pillar-shaped spacer a curved surface.

14. The method according to claim 13, wherein at the time of forming the pillow-shaped spacer in the array substrate, making an upper surface of the pillow-shaped spacer a curved surface comprises:
   at the time of forming the source/drain metal layer of the thin film transistor in the array substrate, forming the source/drain metal layer in a non-thin film transistor region of the array substrate;
   at the time of forming the passivation layer on the source/drain metal layer, forming the passivation layer having a curved surface on the source/drain metal layer in the non-thin film transistor region of the array substrate.

15. The method according to claim 13, wherein the curved surface of the pillow-shaped spacer is a protrusion towards the pillar-shaped spacer.

16. The method according to claim 13, wherein the curved surface of the pillow-shaped spacer is hemispherical, wavy, or zigzag.

* * * * *